United States Patent [19]

VanSlyke

[11] Patent Number: 5,047,687
[45] Date of Patent: Sep. 10, 1991

[54] ORGANIC ELECTROLUMINESCENT DEVICE WITH STABILIZED CATHODE

[75] Inventor: Steven A. VanSlyke, Rochester, N.Y.

[73] Assignee: Eastman Kodak Company, Rochester, N.Y.

[21] Appl. No.: 557,848

[22] Filed: Jul. 26, 1990

[51] Int. Cl.$^5$ .................. H05B 33/26; B32B 15/04
[52] U.S. Cl. .................. 313/503; 313/504; 313/506; 428/457
[58] Field of Search .................. 313/503, 504, 506; 428/457

[56] References Cited

U.S. PATENT DOCUMENTS

| | | | |
|---|---|---|---|
| 3,530,325 | 9/1970 | Mehl et al. | 313/108 |
| 3,621,321 | 11/1971 | Williams | 313/108 A |
| 4,356,429 | 10/1982 | Tang | 313/503 |
| 4,539,507 | 9/1985 | VanSlyke et al. | 313/504 |
| 4,719,152 | 1/1988 | Ohta et al. | 313/506 |
| 4,720,432 | 1/1988 | VanSlyke et al. | 428/457 |
| 4,769,292 | 9/1988 | Tang et al. | 428/690 |
| 4,885,211 | 12/1989 | Tang et al. | 428/457 |

Primary Examiner—Sandra L. O'Shea
Attorney, Agent, or Firm—Carl O. Thomas

[57] ABSTRACT

An organic electroluminescent device is disclosed which is protected from dark spot formation. The device is comprised of, in sequence, a support, an anode, an organic electroluminescent medium, and a cathode. The cathode contains a plurality of metals, at least one of which is a low work function metal other than an alkali metal. Overlying the cathode is a protective layer comprised of a mixture of at least one organic component of the organic electroluminescent medium and at least one metal having a work function in the range of from 4.0 to 4.5 eV capable of being oxidized in the presence of ambient moisture.

14 Claims, 1 Drawing Sheet

FIG.1

ORGANIC ELECTROLUMINESCENT DEVICE WITH STABILIZED CATHODE

FIELD OF THE INVENTION

This invention relates to organic electroluminescent devices. More specifically, this invention relates to devices which emit light from a current conducting organic layer.

BACKGROUND OF THE INVENTION

Electroluminescent devices (hereinafter also referred to as EL devices) contain spaced electrodes separated by an electroluminescent medium that emits electromagnetic radiation, typically light, in response to the application of an electrical potential difference across the electrodes. The electroluminescent medium must not only be capable of luminescing, but must also be capable of fabrication in a continuous form (i.e., must be pin hole free) and must be sufficiently stable to facilitate fabrication and to support device operation.

Initially organic EL devices were fabricated using single crystals of organic materials, as illustrated by Mehl et al U.S. Pat. No. 3,530,325 and Williams U.S. Pat. No. 3,621,321. Single organic crystal EL devices were relatively difficult to fabricate and further did not readily lend themselves to thin film constructions.

In recent years preferred organic EL devices have been constructed employing thin film deposition techniques. Using an anode as a device support, the organic electroluminescent medium has been deposited as one or a combination of thin films followed by the deposition of a cathode, also formed as a thin film deposition. Thus, starting with the anode structure, it is possible to form the entire active structure of an organic EL device by thin film deposition techniques. As employed herein the term "thin film" refers to layer thicknesses of less than 5 $\mu$m, with layer thicknesses of less than about 2 $\mu$m being typical. Examples of organic EL devices containing organic electroluminescent medium and cathode constructions formed by thin film deposition techniques are provided by Tang U.S. Pat. No. 4,356,429, VanSlyke et al U.S. Pat. Nos. 4,539,507 and 4,720,432, and Tang et al U.S. Pat. No. 4,769,292.

While the art has encountered little difficulty in constructing fully acceptable stable anodes for internal junction organic EL devices, cathode construction has been a matter of extended investigation. In selecting a cathode metal, a balance must be struck between metals having the highest electron injecting efficiencies and those having the highest levels of stability. The highest electron injecting efficiencies are obtained with alkali metals, which are too unstable for convenient use, while metals having the highest stabilities show limited electron injection efficiencies and are, in fact, better suited for anode construction.

Tang U.S. Pat. No. 4,356,429 teaches to form cathodes of organic EL devices of metals such as indium, silver, tin, and aluminum. Van Slyke et al U.S. Pat. No. 4,539,507 teaches to form the cathodes of organic EL devices of metals such as silver, tin, lead, magnesium, maganese and aluminum. Tang et al U.S. Pat. No. 4,885,211 teaches to form the cathodes of organic EL devices of a combination of metals, with at least 50 percent (atomic basis) of the cathode being accounted for by a metal having a work function of less than 4.0 eV.

RELATED PATENT APPLICATIONS

Van Slyke et al (I) U.S. Ser. No. 558,285, concurrently filed and commonly assigned, titled ELECTROLUMINESCENT DEVICE WITH IMPROVED CATHODE, discloses an organic EL device comprised of a cathode containing a combination of magnesium and aluminum.

Van Slyke et al (II) U.S. Ser. No. 561,552, concurrently filed and commonly assigned, titled ELECTROLUMINESCENT DEVICE WITH ORGANIC ELECTROLUMINESCENT MEDIUM, discloses an organic electroluminescent medium including a hole injecting and transporting zone containing an aromatic tertiary amine containing at least two tertiary amine moieties and including attached to a tertiary amine nitrogen atom an aromatic moiety containing at least two fused aromatic rings.

SUMMARY OF THE INVENTION

Despite improvements in the construction of organic EL devices, a persistent problem has been dark spot formation in enviroments in which the organic EL device is exposed to some level of moisture in the ambient atmosphere. Microscopic analysis of organic EL devices exhibiting dark spot behavior has revealed oxidation of the cathode occurring at its interface with the organic electroluminescent medium. It is believed that the oxidation of the cathode metal at its interface with the organic electroluminescent medium creates a resistive barrier to current flow in affected areas of the organic EL device. Without current flow in an area of the organic EL device, no electroluminescence can occur, and the result is seen as a dark spot when other areas of organic EL device are emitting.

The present invention has as its purpose to minimize, postpone or eliminate the emergence of dark spots in organic EL devices.

In one aspect this invention is directed to an organic electroluminescent device comprised of, in sequence, a support, an anode, an organic electroluminescent medium, and a cathode. The organic electroluminescent device is characterized in that the cathode is comprised of a layer consisting essentially of a plurality of metals other than alkali metals, at least one of the metals having a work function of less than 4 eV and, overlying the cathode, a protective layer comprised of a mixture of at least one organic component of the organic electroluminescent medium and at least one metal having a work function in the range of from 4.0 to 4.5 eV capable of being oxidized in the presence of ambient moisture.

It is a further object of the invention to provide an organic EL device having improved cathode characteristics that is compatible with formation by thin film deposition techniques.

BRIEF DESCRIPTION OF THE DRAWINGS

The drawings are necessarily of a schematic nature, since the thicknesses of the individual layers are too thin and thickness differences of the various elements are too greater to permit depiction to scale or to permit convenient proportionate scaling.

DESCRIPTION OF PREFERRED EMBODIMENTS

Figure 1:
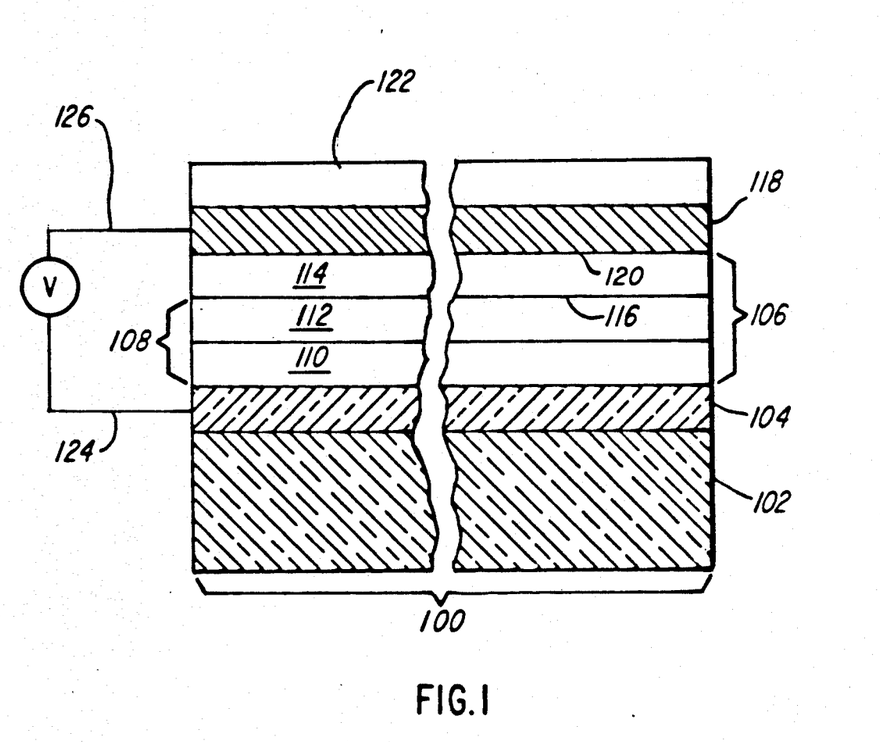
FIG. 1 is schematic diagram of an organic EL device according to the invention.

An organic electroluminescent (EL) device 100 is shown in FIG. 1 consisting of a light transmissive support 102 onto which is coated a light transmissive anode 104. Overlying the anode is an organic electroluminescent medium 106. As shown, the organic electroluminescent medium is divided into (1) a hole injecting and transporting zone 108, which is further divided into (a) a hole injecting layer 110 contacting the anode and (b) an overlying hole transporting layer 112, and (2) an electron injecting and transporting zone 114 forming a junction 116 with the hole transporting layer.

A cathode 118 overlies and forms an electron injecting interface 120 with the organic electroluminescent medium. A protective layer 122 overlies the cathode.

In use the anode 104 and cathode 118 are connected to an external power source V by conductors 124 and 126, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The organic EL device can be viewed as a diode which is forward biased when the anode is at a higher potential than the cathode. Under these conditions injection of holes occurs from the anode into the hole injecting layer 110 of the hole injecting and transporting zone 106. The holes are transported across the hole transporting layer 112 and across the junction 116 into the electron injecting and transporting zone 114. Concurrently electrons are injected from the cathode 118 into the electron injecting and transporting zone 114. When a migrating electron drops from its conduction band potential to a valence band in filling a hole, energy is released as light. Depending upon the choice of alternative constructions, the released light can be emitted from the organic electroluminescent medium through one or more edges of the organic electroluminescent medium separating the electrodes, through the anode and support, through the cathode, or through any combination of the foregoing. Since the organic electroluminescent medium is quite thin, it is usually preferred to emit light through one of the two electrodes. In the preferred form of the EL device shown the anode and support are specifically constructed to be light transmissive, thereby facilitating emission through these elements.

Reverse biasing of the electrodes reverses the direction of mobile charge migration, depletes the organic electroluminescent medium of mobile charge carriers, and terminates light emission. When an AC power source is employed, the internal junction organic EL devices are forward biased during a portion of each period and reverse biased during the remaining portion of the period.

To allow the organic EL device to operate efficiently the cathode must contain at least one metal having a relative low (less than 4.0 eV) work function in contact with the organic electroluminescent medium. Therefore, the lowest work function metal present in the cathode at the interface is particularly susceptible to oxidation. The presence of moisture in the ambient atmosphere surrounding the organic EL device has been observed to lead to oxidation of the cathode low work function metal at its interface with the organic electroluminescent medium, even when a low work function metal is present in only a limited amount or is overcoated with a higher work function metal.

While the susceptibility of the cathode to oxidation is inherent in the materials and operation of the cathode of an efficient organic EL device, there are additional contributing factors. In constructing organic EL devices by thin film forming techniques, the cathode is rarely greater than about 2 $\mu$m in thickness, preferably less than about 5000 Å in thickness. The thin film deposition techniques, such as vacuum vapor deposition, sputtering and the like, used to form the cathode in these thickness ranges do not produce impervious layers. Microchannels (microscopic local disruptions) are believed to be present in the cathodes that allow moisture migration through the cathode to its interface with the organic electroluminescent medium.

It has been observed that dark spot formation in organic EL devices can be controlled by overcoating the cathode with a protective layer comprised of a mixture of a metal having a work function in the range of from 4.0 to 4.5 eV and at least one organic component of the organic electroluminescent medium. Surprisingly, neither the metal alone nor the the organic component alone have been found to be effective as a protective layer for dark spot reduction. Further, when the metal and organic component are coated successively as superimposed layers, they are also ineffective to stabilize the organic EL device against dark spot formation.

The selection of metals for the protective layer having a work function in the range of from 4.0 to 4.5 eV provides metals that are not so reactive as to create stability concerns during device fabrication, yet are sufficiently reactive to be oxidized by ambient atmospheric moisture over an extended period of time when incorporated into the organic EL device. Representative metals in the preferred work function range include aluminum, vanadium, chromium, iron, cobalt, nickel, copper, zinc, tin, antimony, tantalum and lead. All of these metals can be readily deposited by vacuum vapor deposition, sputtering and similar thin film deposition techniques. While these metals oxidize slowly as bulk metals, in mixtures, such as those produced by thin film codeposition techniques, the metals exhibit a high surface to volume ratio that enhances their oxidation susceptibility.

The organic material that is mixed with the metal in the protective layer can be any of the various organic materials known to be useful in forming the organic electroluminescent medium of the EL device. The reason for choosing one of the organic materials contained in the organic electroluminescent medium is to provide a practical advantage in device construction. The protective layer can be formed without introducing any requirement for an additional organic material deposition capability. Rather, codeposition of the metal and organic component of the protective layer can be achieved using any of the same materials and deposition procedures employed for producing the organic electroluminescent medium. If, for example, the organic electroluminescent medium is formed by vacuum vapor deposition of a particular organic component, this same deposition procedure can be used again after cathode formation, modified only by the concurrent deposition of the metal component. Since the metal component is preferably supplied independently from a separate source during codeposition, minimal, if any, modification of the organic deposition technique employed during formation of the organic electroluminescent medium is contemplated during codeposition of the protective layer. Usually, only the rate of deposition is varied to achieve the desired porportion of the organic component to the metal component of the protective layer.

The proportion of the metal and organic components of the protective layer can be widely varied. Since the amount of moisture can be intercepted in route to the cathode is dependent on the amount of metal present in the protective layer, it is generally preferred that the protective layer contain at least about 20 percent of the metal. (Except as otherwise noted, percent is in each instance weight percent, based on total weight.) The minimum amount of the organic component is that required to keep the metal sufficiently dispersed to maintain a high surface to volume ratio. Generally at least 10 percent by weight of the organic component is more than sufficient to accomplish this function. Thus, it is generally preferred that the metal account for from about 20 to 90 percent (optimally from about 30 to 80 percent) of the protective layer with the organic component accounting for from 10 to 80 percent (optimally from about 20 to 70 percent) of the protective layer.

The duration of protection against dark spot formation of the organic EL device is a function of the amount of metal present in the protective layer for any given ambient moisture level. The thickness of the protective layer as well as the proportion of metal in the protective layer determines the total amount of metal present. For short term stabilization any thickness of the protective layer sufficient to provide a continuous coating of the cathode is effective. Generally protective layer thicknesses of at least about 200 Å (optimally at least about 500 Å) are contemplated to assure continuous coverage of the cathode. Maximum protective layer thicknesses are a function of coating convenience. Using thin film deposition techniques thicknesses up to about 2 $\mu$m (optimally up to about 1 $\mu$m) are preferred for the protective layer.

The cathode of the organic EL device can be constructed of any conventional metal or combination of metals, other than an alkali metal (excluded as being too unstable), provided at least one of the metals present exhibits a low work function—that is, less than about 4.0 eV. If no low work function metal is present, the organic EL device will have a reduced capability of injecting electrons into the organic electroluminescent medium and consequently a relatively low efficiency. Preferred cathodes are those constructed of a combination of a metal having a low (<4.0 eV) work function and one other metal, preferably a metal having a work function greater than 4.0 eV. The metals can be employed in extremely wide proportions, ranging from about <1 percent to >99 percent of the low work function metal with another metal, preferably a higher work function metal (e.g., a metal having a work function >4.0 eV), forming the balance of the cathode. The combinations of metals taught by Tang et al U.S. Pat. No. 4,885,211, here incorporated by reference, are specifically contemplated for construction of the cathodes of this invention. The Mg:Ag cathodes of Tang et al U.S. Pat. No. 4,885,211 constitute one preferred cathode construction. Aluminum and magnesium cathodes with magnesium constituting at least 0.05 (preferably at least 0.1) percent and aluminum constituting at least 80 (preferably at least 90) percent constitute another preferred cathode construction. The aluminum and magnesium cathodes are the subject matter of the VanSlyke et al (I) concurrently filed patent application cited above.

The anode of the organic EL device can take any convenient conventional form. Typically the anode is constructed of one or a combination of metals having a work function in excess of 4.0 eV. Metals having work functions >4.0 eV are listed by Tang et al U.S. Pat. No. 4,885,211, incorporated by reference above. When, as is preferred, luminescence is intended to occur through the anode, it is preferred to construct the anode of one or a combination of light transmissive metal oxides, such as indium oxide, tin oxide or, optimally, indium tin oxide (ITO).

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent (or substantially transparent) materials are useful. In most instances the light transmissive layers or elements of the organic EL device are also colorless or of neutral optical density—that is, exhibit no markedly higher absorption of light in one wavelength range as compared to another. However, it is, of course, recognized that light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

The organic electroluminescent medium as well as the organic component of the protective layer can be chosen from any one or combination of the organic materials taught to form the organic electroluminescent medium of the organic EL devices disclosed by Tang U.S. Pat. No. 4,356,429, VanSlyke et al U.S. Pat. No. 4,539,507, Tang et al U.S. Pat. Nos. 4,769,292 and 4,885,211, each here incorporated by reference. Although the organic electroluminescent medium can be formed of one or more materials that are either vacuum vapor deposited or solution coated, the organic component of the protective layer is selected from those materials that can be deposited without forming solutions—e.g., by vacuum vapor deposition, sputtering or the similar thin film deposition procedures.

To achieve high levels of organic EL device efficiency it is contemplated to construct the organic electroluminescent medium of at least two different zones, an electron injecting and transporting zone, which is typically a single layer, and a hole injecting and transporting zone. The hole injecting and transporting zone can be constructed also of a single layer, but it is most efficiently constructed of a hole injecting layer and a hole transporting layer.

In a preferred form of the invention a layer containing a porphyrinic compound forms the hole injecting layer of the internal junction organic EL device. A porphyrinic compound is any compound, natural or synthetic, which is derived from or includes the porphyrin structure. Any of the porphyrinic compounds disclosed by Adler U.S. Pat. No. 3,935,031 or Tang U.S.

Pat. No. 4,356,429, the disclosures of which are here incorporated by reference, can be employed.

Preferred porphyrinic compounds are those of structural formula (I):

wherein
Q is —N= or —C(R)=;
M is a metal, metal oxide, or metal halide;
R is hydrogen, alkyl, aralkyl, aryl, or alkaryl, and
$T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred from the porphyrinic compounds differ from those of structural formula (I) by substitution of two hydrogen for the metal atom, as indicated by formula (II):

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1: Porphine
PC-2: 1,10,15,20-Tetraphenyl-21H,23H-porphine copper (II)
PC-3: 1,10,15,20-Tetraphenyl-21H,23H-porphine zinc (II)
PC-4: 5,10,15,20-Tetrakis(pentafluorophenyl)-21H,23H-porphine
PC-5: Silicon phthalocyanine oxide
PC-6: Aluminum phthalocyanine chloride
PC-7: Phthalocyanine (metal free)
PC-8: Dilithium phthalocyanine
PC-9: Copper tetramethylphthalocyanine
PC-10: Copper phthalocyanine
PC-11: Chromium phthalocyanine fluoride
PC-12: Zinc phthalocyanine
PC-13: Lead phthalocyanine
PC-14: Titanium phthalocyanine oxide
PC-15: Magnesium phthalocyanine
PC-16: Copper octamethylphthalocyanine The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

wherein
$Q^1$ and $Q^2$ are independently aromatic tertiary amine moieties and
G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

where
$R^1$ and $R^2$ each independently represents a hydrogen atom, an aryl group or alkyl group or $R^1$ and $R^2$ together represent the atoms completing a cycloalkyl group and
$R^3$ and $R^4$ each independently represents an aryl group which is in turn substituted with a diaryl substituted amino group, as indicated by structural formula (V):

wherein R⁵ and R⁶ are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraaryldiamines include those represented by formula (VI).

wherein
Are is an arylene group,
n is an integer of from 1 to 4, and
Ar, R⁷, R⁸, and R⁹ are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Following the teachings of VanSlyke et al (II), cited above, it is possible to achieve higher organic EL device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0–50 hours) and long term (0–300+ hours) of operation are achieved when the aromatic tertiary amines are those which (1) are comprised of at least two tertiary amine moieties and (2) include attached to a tertiary amine nitrogen atom an aromatic moiety containing at least two fused aromatic rings. The following is a listing of exemplary aromatic compounds containing at least two fused aromatic rings and from 10 to 24 ring carbon atoms:
Naphthalene,
Azulene,
Heptalene,
as-Indacene,
s-Indacene,
Acenaphthylene,
Phenalene,
Phenanthrene,
Anthracene,
Fluoranthrene,
Acephenathrylene,
Aceantrylene,
Triphenylene,
Pyrene,
Chrysene,
Naphthacene,
Pleiadene,
Picene,
Perylene,
Pentaphene,
Hexaphene,
Rubicene, and
Coronene.

The fused aromatic ring moieties of the tertiary amines preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:
ATA-1: 1,1-Bis(4-di-p-tolylaminophenyl)-cyclohexane
ATA-2: 1,1-Bis(4-di-p-tolylaminophenyl)-4-phenylcyclohexane
ATA-3: 4,4'-Bis(diphenylamino)quadriphenyl
ATA-4: Bis(4-dimethylamino-2-methylphenyl)-phenylmethane
ATA-5: N,N,N-Tri(p-tolyl)amine
ATA-6: 4-(di-p-tolylamino)-4'-[4(di-p-tolylamino)-styryl]stilbene
ATA-7: N,N,N',N'-Tetra-p-tolyl-4,4'-diaminobiphenyl
ATA-8: N,N,N',N'-Tetraphenyl-4,4'-diaminobiphenyl
ATA-9: N-Phenylcarbazole
ATA-10: Poly(N-vinylcarbazole)
ATA-11: 4,4'-Bis[N-(1-naphthyl)-N-phenylamino]-biphenyl
ATA-12: 4,4''-Bis[N-(1-naphthyl)-N-phenylamino]-p-terphenyl
ATA-13: 4,4'-Bis[N-(2-naphthyl)-N-phenylamino]-biphenyl
ATA-14: 4,4'-Bis[N-(3-acenaphthenyl)-N-phenylamino]biphenyl
ATA-15: 1,5-Bis[N-(1-naphthyl)-N-phenylamino]-naphthalene
ATA-16: 4,4'-Bis[N-(9-anthryl)-N-phenylamino]-biphenyl
ATA-17: 4,4''-Bis[N-(1-anthryl)-N-phenylamino]-p-terphenyl
ATA-18: 4,4'-Bis[N-(2-phenanthryl)-N-phenylamino]-biphenyl
ATA-19: 4,4'-Bis[N-(8-fluoranthenyl)-N-phenylamino]-biphenyl
ATA-20: 4,4'-Bis[N-(2-pyrenyl)-N-phenylamino]biphenyl ATA-21: 4,4'-Bis[N-(2-naphthacenyl)-N-phenylamino]-biphenyl
ATA-22: 4,4'-Bis[N-(2-perylenyl)-N-phenylamino]-biphenyl
ATA-23: 4,4'-Bis[N-(1-coronenyl)-N-phenylamino]-biphenyl
ATA-24: 2,6-Bis(di-p-tolylamino)naphthalene
ATA-25: 2,6-Bis[di-(1-naphtyl)amino]naphthalene
ATA-26: 2,6-Bis[N-(1-naphthyl)-N-(2-naphthyl)amino]-naphthalene
ATA-27: 4,4''-Bis[N,N-di(2-naphthyl)amino]terphenyl
ATA-28: 4,4'-Bis{N-phenyl-N-[4-(1-naphthyl)phenyl]amino}biphenyl
ATA-29: 4,4'-Bis[N-phenyl-N-(2-pyrenyl)amino]biphenyl
ATA-30: 2,6-Bis[N,N-di(2-naphthyl)amine]fluorene
ATA-31: 4,4''-Bis(N,N-di-p-tolylamino)terphenyl
ATA-32: Bis(N-1-naphthyl)(N-2-naphthyl)amine Any conventional electron injecting and transporting compound or compounds can be employed in forming the layer of the organic electroluminescent medium adjacent the cathode. This layer can be formed by historically taught electroluminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", *RCA Review*, Vol. 30, pp. 322-334, 1969; and Dresner U.S. Pat. No. 3,710,167.

Among electron injecting and transporting zone compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron injecting and transporting zone compounds which can be used to form the layer adjacent the cathode are optical brighteners, particularly those disclosed by Van Slyke et al U.S. Pat. No. 4,539,507, cited above and here incorporated by reference. Useful optical brighteners include those satisfying structural formulae (VII) and (VIII):

wherein
$R^1$, $R^2$, $R^3$, and $R^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VII) at least two of $R^3$, $R^4$ and $R^5$ are saturated aliphatic of from 3 to 10 carbon atoms, e.g., propyl, butyl, heptyl and the like;

Z is —O—, —NH—, or —S—; and
Y is wherein
m is an integer of from 0 to 4;
n is arylene of from 6 to 10 carbon atoms, for example, phenylene and naphthylene; and
$Z'$ and $Z''$ are individually N or CH.

As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618-637 and 640. Those that are not already thin-film-forming can be rendered so by attaching an aliphatic moiety to one or both end rings.

Particularly preferred for use in forming the electron injecting and transporting layers of the organic EL devices of this inventions are metal chelated oxinoid compounds, including chelates of oxine (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (IX):

wherein
Me represents a metal;
n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:
CO-1: Aluminum trisoxine
  [a.k.a., tris(8-quinolinol) aluminum]
CO-2: Magnesium bisoxine
  [a.k.a., bis(8-quinolinol) magnesium]
CO-3: Bis[benzo{f}-8-quinolinol] zinc
CO-4: Tris(2-methyl-8-quinolinolato) aluminum
CO-5: Indium trisoxine
  [a.k.a., tris(8-quinolinol) indium]
CO-6: Aluminum tris(5-methyloxine)
  [a.k.a., tris(5-methyl-8-quinolinol) aluminum]
CO-7: Lithium oxine
  [a.k.a., 8-quinolinol lithium]
CO-8: Gallium tris(5-chlorooxine)
  [a.k.a, tris(5-chloro-8-quinolinol) gallium]
CO-9: Calcium bis(5-chlorooxine)
  [a.k.a, bis(5-chloro-8-quinolinol) calcium]
CO-10: Poly[zinc (II)-bis(8-hydroxy5-quinolinyl)methane]
CO-11: Dilithium epindolidione In the organic EL devices of the invention it is possible to maintain a current density compatible with efficient light emission while employing a relatively low voltage across the electrodes by limiting the total thickness of the organic luminescent medium to less than 1 $\mu m$ (10,000 Angstroms). At a thickness of less than 1 $\mu m$ an applied voltage of 20 volts results in a field potential of greater than $2 \times 10^5$ volts/cm, which is compatible with efficient light emission. An order of magnitude reduction (to 0.1 $\mu m$ or 1000 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the organic EL device. Even a single pin hole extending through the organic electroluminescent medium will allow shorting to occur. Unlike conventional organic EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chance of pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic electroluminescent medium are each capable of fabrication in the form of a thin film—that is, capable of being fabricated as a continuous layer having a thickness of less than 0.5 $\mu m$ or 5000 Angstroms.

When one or more of the layers of the organic luminescent medium are solvent coated, a film forming polymeric binder can be conveniently co-deposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material binders are preferably limited to less than 50 percent by weight, based on the total weight of the material forming the layer.

The preferred active materials forming the organic electroluminescent medium are both film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer, and a chelated oxinoid compound as an electron injecting and transporting layer, thicknesses in the range of from about 50 to 5000 Angstroms are contemplated, with layer thicknesses in the range of from 100 to 2000 Angstroms being preferred. It is generally preferred that the overall thickness of the organic luminescent medium be at least about 1000 Angstroms.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device. Examples with a number bearing the suffix E represent embodiments of the invention while Examples with a number bearing the suffix C are included for the purpose of comparing variations.

EXAMPLE 1C

Protective Layer Absent

An organic EL device containing a three layer organic luminescent medium was constructed in the following manner:
(a) A transparent anode of indium tin oxide coated glass was polished with 0.05 $\mu m$ alumina abrasive for a few minutes, followed by ultrasonic cleaning in a 1:1 (volume) mixture of isopropyl alcohol and distilled water. It was rinsed with isopropyl alcohol and then immersed in toluene vapor for about 5 minutes.

(b) A hole injecting PC-10 (350 Å) layer was deposited on the anode by vacuum deposition. PC-10 was evaporated from a quartz boat using a tungsten filament.

(c) A hole transporting ATA-1 (350 Å) layer was then deposited on top of the PC-10 layer. ATA-1 was also evaporated from a quartz boat using a tungsten filament.

(d) An electron injecting and transporting CO-1 (600 Å) layer was then deposited on top of the ATA-1 layer. CO-1 was also evaporated from a quartz boat using a tungsten filament.

(e) On top of the CO-1 layer was deposited a cathode, consisting of a 250 Å electron injecting layer formed of a 10:1 volume ratio of Mg and Al and a 2000 Å Al capping layer.

The cell was encapsulated by placing a glass cover over the cathode and applying Norland 60 TM optical adhesive around the periphery of the cell, thereby bonding the glass support bearing the anode to the glass cover. When operated immediately following fabrication the cell exhibited no dark spots—i.e., light emission was uniform over the entire anode surface. After 70 days of storage under ambient laboratory conditions (at or near standard temperature and pressure, with humidity varying with weather conditions), operation of the cell revealed that about 25 percent of the total area over which light was initially emitted was occupied by dark spots.

EXAMPLE 2C

Organic Protective Layer

Example 1C was repeated, except that a 2000 Å protective layer of CO-1 was vacuum vapor deposited over the cathode prior to encapsulating the cell. After 70 days of storage under identical conditions as in Example 1C approximately the same percentage of the initial emitting area was occupied by dark spots as in Example 1C. This showed the organic material CO-1 to be ineffective in itself to reduce dark spot formation.

EXAMPLE 3C

Aluminum Protective Layer

Example 1C was repeated, except that a 2000 Å protective layer of aluminum was vacuum vapor deposited over the cathode prior to encapsulating the cell. In other words, a total of 4000 Å aluminum was deposited over the Mg:Al electron injecting layer. After 70 days of storage under identical conditions as in Example 1C approximately the same percentage of the initial emitting area was occupied by dark spots as in Example 1C. This showed the additional aluminum to be ineffective in itself to reduce dark spot formation.

EXAMPLE 4C

Metal Protective Layer Overcoated with Organic Protective Layer

Example 1C was repeated, except that a 1000 Å protective layer of aluminum was vacuum vapor deposited on the cathode (for a total of 3000 Å aluminum including the capping layer) followed by the vacuum vapor deposition of a 1000 Å protective layer of CO-1 prior to encapsulating the cell. After 70 days of storage under identical conditions as in Example 1C approximately the same percentage of the initial emitting area was occupied by dark spots as in Example 1C. This showed a superimposed combination of a metal protective layer and an organic material protective layer to be ineffective to reduce dark spot formation.

EXAMPLE 5E

Mixed Metal and Organic Component Protective Layer

Example 1C was repeated, except that a 2000 Å protective layer consisting of aluminum and CO-1 in a 2:1 weight ratio, laid down by vacuum vapor codeposition, was formed on the cathode prior to encapsulating the cell. After 70 days of storage under identical conditions as in Example 1C, less than 0.5% of total initially emitting surface area of the cell was occupied by dark spots. This demonstrated the effectiveness of the codeposited aluminum and organic component of the organic electroluminescent medium to curtail dark spot formation.

EXAMPLE 6E

Varied Cathode Composition

Example 5E was repeated, except that the cathode consisted of a 2000 Å layer of magnesium and silver in a volume ratio of 10:1. After 70 days of storage under identical conditions as in Example 1C, less than 0.5% of total initially emitting surface area of the cell was occupied by dark spots. This demonstrates that cathodes of varied composition are similarly protected by the protective layers of this invention.

The invention has been described in detail with particular reference to preferred embodiments thereof, but it will be understood that variations and modifications can be effected within the spirit and scope of the invention.

What is claimed is:

1. An organic electroluminescent device comprising in sequence, a support, an anode, an organic electroluminescent medium, and a cathode,
    characterized in that
        said cathode is comprised of a layer consisting essentially of a plurality of metals other than alkali metals, at least one of said metals having a work function of less than 4 eV, and,
        overlying said cathode, a protective layer comprised of a mixture of
    at least one organic component of said organic electroluminescent medium and
    at least one metal having a work function in the range of from 4.0 to 4.5 eV capable of being oxidized in the presence of ambient moisture.

2. An organic electroluminescent device according to claim 1 further characterized in that said anode is light transmissive.

3. An organic electroluminescent device according to claim 1 further characterized in that said organic electroluminescent medium includes an organic electron injecting and transporting zone.

4. An organic electroluminescent device according to claim 3 further characterized in that said organic electron injecting and transporting zone is comprised of a stilbene or chelated oxinoid compound.

5. An organic electroluminescent device according to claim 3 further characterized in that at least one said organic component of said protective layer is also present in said organic electron injecting and transporting zone.

6. An organic electroluminescent device according to claim 1 further characterized in that said organic electroluminescent medium includes a hole injecting and transporting zone.

7. An organic electroluminescent device according to claim 6 further characterized in that said hole injecting and transporting zone includes at least one aromatic tertiary amine.

8. An organic electroluminescent device according to claim 6 further characterized in that said hole injecting and transporting zone includes at least one porphorinic compound.

9. An organic electroluminescent device according to claim 6 further characterized in that least one said organic component of said protective layer is also present in said organic hole injecting and transporting zone.

10. An organic electroluminescent device according to claim 1 further characterized in that said protective layer has a thickness of at least 200 Å.

11. An organic electroluminescent device according to claim 1 further characterized in that said protective layer has a thickness of up to 5 μm.

12. An organic electroluminescent device according to claim 11 further characterized in that said protective layer has a thickness in the range of from 500 Å to 2 μm.

13. An organic electroluminescent device according to claim 1 further characterized in that said metal present in said protective layer accounts for 20 to 90 percent by weight of said protective layer, based on total weight.

14. An organic electroluminescent device according to claim 13 further characterized in that said metal present in said protective layer accounts for 30 to 80 percent by weight of said protective layer, based on total weight.

* * * * *